United States Patent
Wolfer et al.

(10) Patent No.: US 6,517,895 B1
(45) Date of Patent: Feb. 11, 2003

(54) METHOD OF COATING BOTH SIDES OF PRINTED CIRCUIT BOARDS HAVING HOLES

(75) Inventors: Klaus Wolfer, Schopfheim (DE); Dietmar Leibrock, Rickenbach (DE)

(73) Assignee: Vantico Inc., Brewster, NY (US)

( * ) Notice: Subject to any disclaimer, the term of this patent is extended or adjusted under 35 U.S.C. 154(b) by 0 days.

(21) Appl. No.: 09/719,803
(22) PCT Filed: Jun. 11, 1999
(86) PCT No.: PCT/EP99/04044
§ 371 (c)(1),
(2), (4) Date: Mar. 12, 2001
(87) PCT Pub. No.: WO99/67978
PCT Pub. Date: Dec. 29, 1999

(30) Foreign Application Priority Data

Jun. 24, 1998 (EP) .............................. 98111665

(51) Int. Cl.⁷ ................................. B05D 5/12
(52) U.S. Cl. ..................... 427/97; 427/209; 427/420; 101/127; 101/129
(58) Field of Search ............................. 427/96, 97, 209, 427/282, 420; 101/127, 129

(56) References Cited

U.S. PATENT DOCUMENTS

| 4,230,793 A | * | 10/1980 | Losert et al. | ................ | 430/315 |
| 4,600,601 A | * | 7/1986 | Tamura | ........................ | 427/96 |
| 5,240,817 A | * | 8/1993 | Stout et al. | .................. | 430/315 |
| 5,402,314 A | * | 3/1995 | Amago et al. | .............. | 361/760 |

FOREIGN PATENT DOCUMENTS

| DE | 3602350 A1 | 1/1986 |
| EP | 03132090 | 5/1991 |
| WO | WO 86/06243 | 10/1986 |

OTHER PUBLICATIONS

S. Crum "Hole Plugging with Liquid Photoimageable Solder Masks" Electronic Packaging & Production, Mar. 1997 pp. 51–53.

* cited by examiner

Primary Examiner—Brian K. Talbot
(74) Attorney, Agent, or Firm—Foley & Lardner

(57) ABSTRACT

In a method of coating substrates, especially printed circuit boards, on both sides, one side of the substrate, which is provided with holes, is coated by a coating process, especially by screen printing, wherein the holes that are not required for the circuit layout are lastingly covered over and the holes that are required are covered over only slightly or are left clear, whereupon the other side of the substrate is coated by a coating process, especially by curtain pouring or spraying, wherein the entire surface of the substrate is provided uniformly with a coating that gives only a light covering over the holes.

3 Claims, 1 Drawing Sheet

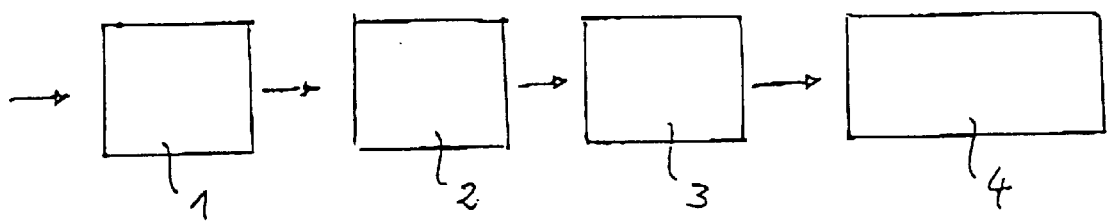

METHOD OF COATING BOTH SIDES OF PRINTED CIRCUIT BOARDS HAVING HOLES

FIELD OF THE INVENTION

The invention relates to a method of coating substrates, especially printed circuit boards, on both sides.

DESCRIPTION OF RELATED ART

Printed circuit boards that are to be coated on both sides with a solder resist, photo-structurable dielectrics or other materials for the technique of sequentially laying-out the printed circuit board have a certain number of holes, some of which are to be covered by solder resist and others of which are to be kept clear for the connection of the circuit, depending upon the layout of the conductor arrangement. It is known to coat printed circuit boards by moving the printed circuit boards through a pouring curtain of the lacquer to be applied, the holes in the printed circuit board being only lightly skimmed over by the poured lacquer, so that good processing conditions are created for the formation of holes in the finished printed circuit board, because the covering over the holes can easily be removed.

In order that the holes that are not required for the conductor arrangement to be applied are lastingly closed, it is also known first to provide on one side of the printed circuit board, by poured application, a coating that only lightly skims over the holes in the printed circuit board with poured lacquer, whereupon that coating is dried in a drying step to such an extent that a screen print can be so applied to the coating that the holes that are not required are lastingly covered or filled up. After the screen printing step, the opposite side of the printed circuit board is coated by means of poured application. The overall result is a procedure having a plurality of individual steps which require a corresponding amount of apparatus.

BRIEF SUMMARY OF THE INVENTION

The problem underlying the invention is to simplify the method of coating printed circuit boards without having any adverse effects on the coating.

That problem is substantially solved according to the invention by coating one side of the printed circuit board by means of a coating process, especially by screen printing, in such a manner that the holes that are not required for the circuit layout are lastingly covered over and the holes that are required are covered over only slightly or are left clear, whereupon the other side of the printed circuit board is coated by means of a coating process, especially by curtain pouring or spraying, so as to give only a light covering over the holes that are required for the circuit layout.

Because the screen printing technique is used for coating one side of the printed circuit board it is possible, together with the coating to be applied, lastingly to cover or fill up those holes which are not required for the circuit layout, while the holes that are required for the circuit layout can be covered over only lightly or can be kept clear. In the second step, the opposite side of the printed circuit board is uniformly coated, for example by the pouring curtain technique, so that in the course of further manufacture the holes that are required for the circuit layout can easily be exposed. In this way, the advantages of the screen printing process are combined with those of the pouring curtain technique for the coating of printed circuit boards, a simplification of the coating process being achieved by the omission of an intermediate step.

A further advantage is that the two sides of a printed circuit board can be coated one immediately after the other and can then be dried together in one step, thus achieving a further simplification of the process, with the advantage that the quality of the coating is increased by the simultaneous drying of both sides.

BRIEF DESCRIPTION OF THE DRAWING

FIG. 1 illustrates one embodiment of the invention wherein a circuit board is coated by screen printing and then by curtain pouring or spraying.

DETAILED DESCRIPTION OF THE INVENTION

The invention will be described in greater detail by way of example with reference to the drawing which shows the procedure in diagrammatic form in a single Figure.

The reference numeral 1 indicates a first station in which a printed circuit board (not shown) provided with a certain number of holes, which forms a substrate, is coated on one side with the coating to be applied, or with solder resist, by screen printing in such a manner that the holes that are not required for the circuit layout are lastingly covered over, while the holes that are open on the finished printed circuit board are left clear or are covered over only slightly by the screen printing process, so that their subsequent exposure requires little effort. The holes that are to be closed lastingly can be filled up with the coating material in the screen printing process so that a plug is produced in the holes which is not affected by the subsequent treatment steps for exposing the lightly covered holes, that is to say which does not result in the hole being exposed.

The reference numeral 2 indicates a turning station into which a printed circuit board that has been coated on one side by screen printing is conveyed and where it is turned over, whereupon it is conveyed into a second coating station 3 in which the other side of the printed circuit board is coated by means of curtain pouring or alternatively by spraying in such a manner that the entire surface of the printed circuit board is uniformly coated and the holes in the printed circuit board are lightly covered over, so that favourable conditions are created for the subsequent treatment of the printed circuit board to expose the holes that are required for the circuit layout.

The printed circuit boards are coated in such a manner, known per se, that the edges of the printed circuit board are kept free of coating and the printed circuit boards can be held at the coating-free edges by means of clips or similar elements that can be arranged on an adjustable rod. Such a holding device for the printed circuit boards is preferably moved through the individual stations together with the boards.

In the turning station 2 it is also possible for the coated side to undergo air extraction during the turning operation, but no drying is provided in the procedure illustrated.

After the second side of the printed circuit board has been coated, the coating on both sides will still be wet, since there is no time-consuming intermediate drying operation between stations 1 and 3. Immediately after the coating station 3, the printed circuit board, which is still wet on both sides, is conveyed to a drying station 4 in which the two sides of the printed circuit board are dried and optionally cooled. The simultaneous drying of the coating on both sides results in a coating of higher quality.

After drying, the printed circuit boards are treated further in a manner known per se in order to provide the circuit layout and to expose the holes required therefor.

The described method is suitable for both thin and relatively thick substrates that are to be coated on both sides.

Instead of screen printing it is also possible to provide some other method of coating by means of which certain holes can be substantially filled up with the coating material, while other holes are kept clear or are only lightly covered over. In the same way, instead of curtain pouring or spraying it is also possible to provide a method of coating for the other side of the substrate that gives only a light covering over the holes.

Especially in the case of relatively thick and correspondingly rigid substrates, it is also possible for the application of the coating by means of curtain pouring or spraying to be effected in the first step and for the screen printing process or a corresponding coating method that fills up the holes to take place in the second step.

We claim:

1. A method for coating a printed circuit board having opposing first and second sides, comprising coating the first side of the circuit board, which is provided with holes, by screen printing, wherein holes that are not required for the circuit layout are lastingly covered over and holes that are required are covered over only slightly or are left clear, and coating the second side of the circuit board by curtain pouring or spraying, wherein the entire surface of the circuit board is provided uniformly with a coating that gives only a light covering over the holes.

2. A method according to claim 1, wherein the step of coating the second side of the printed circuit board is carried out immediately after the step of coating the first side of the printed circuit board, further comprising the step of drying the still-wet coatings of the first and second sides and optionally cooling the first and second sides together in a drying station.

3. A method according to claim 1, wherein the lasting covering-over of the holes that are not required in the circuit board is produced by filling up the holes with the coating material.

* * * * *